United States Patent
Kim et al.

(10) Patent No.: US 6,203,715 B1
(45) Date of Patent: Mar. 20, 2001

(54) METHOD FOR THE MANUFACTURE OF A THIN FILM ACTUATED MIRROR ARRAY

(75) Inventors: You-Kwang Kim; Jae-Hyuk Chung, both of Seoul (KR)

(73) Assignee: Daewoo Electronics Co., Ltd., Seoul (KR)

( * ) Notice: Subject to any disclaimer, the term of this patent is extended or adjusted under 35 U.S.C. 154(b) by 0 days.

(21) Appl. No.: 09/232,824

(22) Filed: Jan. 19, 1999

(51) Int. Cl.[7] .............................. G02B 5/08; H01L 21/00; H05H 1/00

(52) U.S. Cl. ..................... 216/24; 216/58; 438/29; 156/662.1

(58) Field of Search ..................... 216/58, 74, 79, 216/80, 64, 24; 156/345, 662.1, 643; 438/29

(56) References Cited

U.S. PATENT DOCUMENTS

| | | | |
|---|---|---|---|
| 4,190,488 | * | 2/1980 | Winters ................................ 156/643 |
| 4,723,978 | * | 2/1988 | Clodgo et al. .......................... 65/31 |
| 5,637,517 | * | 6/1997 | Choi ....................................... 438/29 |
| 5,677,785 | * | 10/1997 | Koo et al. ............................. 359/291 |
| 5,690,839 | * | 11/1997 | Min ....................................... 216/24 |
| 5,702,569 | * | 12/1997 | Park et al. ......................... 156/662.1 |

* cited by examiner

Primary Examiner—Gregory Mills
Assistant Examiner—Parviz Hassanzadeh
(74) Attorney, Agent, or Firm—Pennie & Edmonds LLP

(57) ABSTRACT

An inventive method for the manufacture of a thin film actuated mirror array comprises the steps of: preparing an active matrix including a substrate, an array of switching devices and an array of connecting terminals; forming a first sacrificial layer including an array of empty cavities; forming an array of actuating structures, each of the actuating structures including an elastic member, a lower electrode, an electrodisplacive member, an upper electrode and a via contact; forming a second sacrificial layer including an array of empty slots; forming an array of mirrors; removing the first and the second sacrificial layer to thereby form the thin film actuated mirror array. The use of a poly-Si as the material for the first and the second sacrificial layers will ensure an easy flattening thereof and an easy removal thereof, resulting an increased otpical efficiency in the thin film actuated mirror thus formed.

8 Claims, 12 Drawing Sheets

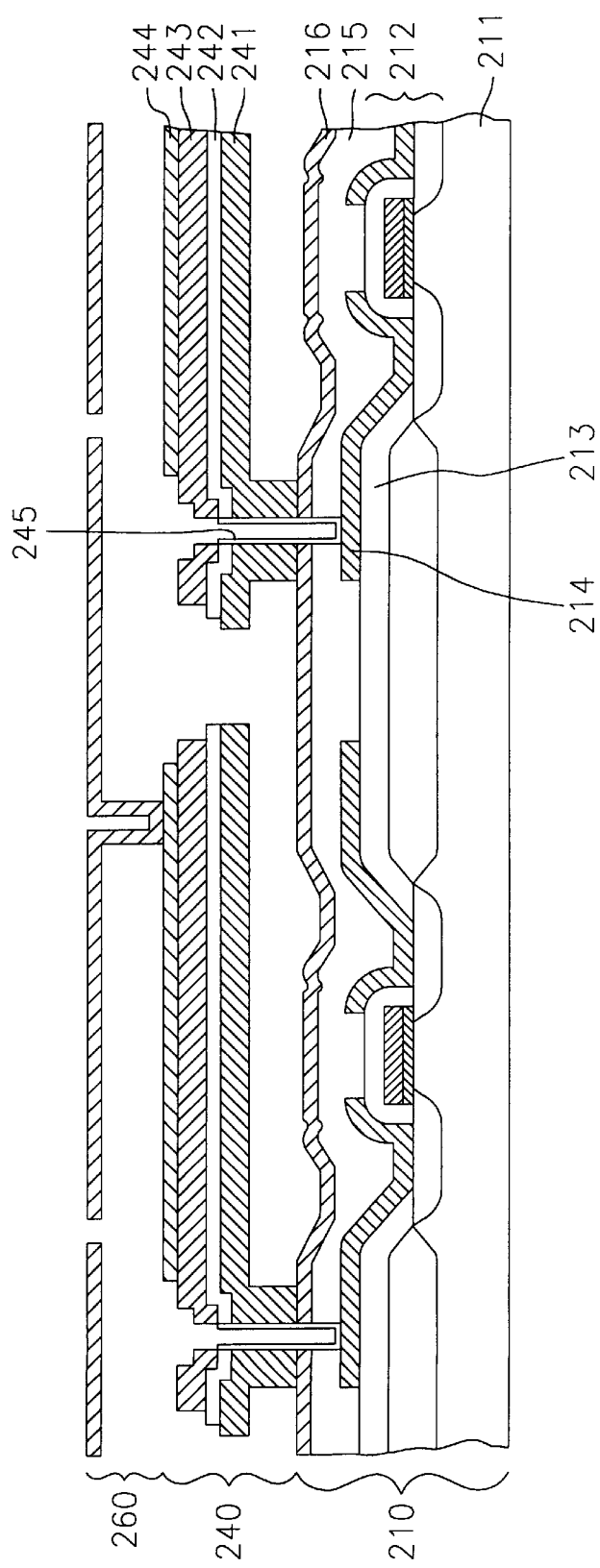

METHOD FOR THE MANUFACTURE OF A THIN FILM ACTUATED MIRROR ARRAY

FIELD OF THE INVENTION

The present invention relates to a method for the manufacture of a thin film actuated mirror array; and, more particularly, to the formation of a tilting mirror using a thin film sacrificial layer made of a poly-Si.

BACKGROUND OF THE INVENTION

Among the various video display systems available in the art, an optical projection system is known to be capable of providing high quality displays in a large scale. In such an optical projection system, light from a lamp is uniformly illuminated onto an array of, e.g., M×N, actuated mirrors, wherein each of the mirrors is coupled with each of the actuators. The actuators may be made of an electrodisplacive material such as a piezoelectric or an electrostrictive material which deforms in response to an electric field applied thereto.

The reflected light beam from each of the mirrors is incident upon an aperture of, e.g., an optical baffle. By applying an electric signal to each of the actuators, the relative position of each of the mirrors to the incident light beam is altered, thereby causing a deviation in the optical path of the reflected beam from each of the mirrors. As the optical path of each of the reflected beams is varied, the amount of light reflected from each of the mirrors which passes through the aperture is changed, thereby modulating the intensity of the beam. The modulated beams through the aperture are transmitted onto a projection screen via an appropriate optical device such as a projection lens, to thereby display an image thereon.

FIGS. 1A to 1E are cross sectional views illustrating a method for manufacturing a thin film actuated mirror array 100.

The process for the manufacture of the array 100 begins with the preparation of an active matrix 110 including a substrate 111, an array of switching devices 112, an array of connecting terminals 113, a passivation layer 114 and an etchant stopping layer 115, as shown in FIG. 1A. Each of the switching devices 112 made of, e.g., metal-oxide-semiconductor field effect transistors (MOSFET), is fabricated on top of the substrate 111 made of, e.g., Si-wafer, by using a common integrated-circuit process. Each of connecting terminals 113 made of a metal, e.g., tungsten (W), is electrically connected to a corresponding switching device in the switching device array 112. The passivation layer 114 made of, e.g., PSG, and having a thickness of 0.1–2 μm, is formed on top of the switching device array 112 and the connecting terminal array 113 by using, e.g., a CVD or a spin coating method. The etchant stopping layer 115 made of silicon nitride and having a thickness of 0.1–2 μm, is deposited on top of the passivation layer 114 by using a low pressure chemical vapor deposition (LPCVD) method or a plasma enhanced chemical vapor deposition (PECVD) method.

In a subsequently step, a thin film sacrificial layer 120, made of a phosphorus silicate glass (PSG) and having a flat top surface, is formed on top of the active matrix 110 by using a spin coating method. Since the thin film sacrificial layer 120 should endure the high-temperature process in the manufacturing process followed herebelow, the phosphor-silicate glass is chosen as a material for the thin film sacrificial layer 120. Then, an array of empty cavities 125 is created in the thin film sacrificial layer 120 to expose the active matrix 110 by using a dry or a wet etching method, as shown in FIG. 1B.

In a next step, an elastic layer 131, made of a nitride, e.g., silicon nitride, and having a thickness of 0.1–2 μm, is deposited on top of the thin film sacrificial layer 120 including the empty cavities 125 by using a LPCVD or a PECVD method.

Thereafter, a lower thin film layer 132, made of an electrically conducting material, e.g., Pt or Pt/Ta, and having a thickness of 0.1–2 μm, is formed on top of the elastic layer 131 by using a sputtering or a vacuum evaporation method.

Then, a thin film electrodisplacive layer 133, made of a piezoelectric material, e.g., PZT, or an electrostrictive material, e.g., PMN, and having a thickness of 0.1–2 μm, is deposited on top of the lower thin film layer 132 by using an evaporation, a sol-gel, a sputtering or a CVD method.

Subsequently, an upper thin film layer 134, made of an electrically conducting and light reflecting material, e.g., aluminum (Al) or silver (Ag), and having a thickness of 0.1–2 μm, is formed on top of the thin film electrodisplacive layer 133 by using a sputtering method, thereby forming a multiple layered structure 130, as shown in FIG. 1C.

In an ensuing step, the multiple layered structure 130 is patterned by using a photolithography or a laser trimming method to expose the thin film sacrificial layer 120.

In a subsequent step, an array of via contacts 145 made of a metal, e.g., tungsten(W), is formed by using a lift-off method, thereby forming an array of actuating structures 140, wherein each of actuating structures 140 includes an upper thin film electrode 144, a thin film electrodisplacive member 143, a lower thin film electrode 142, an elastic member 141 and a via contact 145, as shown in FIG. 1D. Each of the via contacts 145 extends from top of the lower thin film electrode 142 to top of a corresponding connecting terminal in the connecting terminal array 113. Each of the lower thin film electrodes 142 is electrically connected to the corresponding connecting terminal 113, thereby functioning as a signal electrode and each of the upper thin film electrodes 144 is electrically connected to ground, thereby functioning as a common bias electrode as well as a mirror.

Finally, the thin film sacrificial layer 120 is removed by using a wet etching method using an etchant or a chemical, e.g., hydrogen fluoride (HF) vapor, to thereby form the thin film actuated mirror array 100, as shown in FIG. 1E.

One of the problems in using the above-described the method for manufacturing the thin film actuated mirror array is the overall optical efficiency of the resulting thin film actuated mirrors. When each of the thin film actuated mirrors deforms in response to an electric field applied across the thin film electrodisplacive member therein, the upper thin film electrode attached thereto, which also acts as a mirror, also deforms to thereby, instead of creating a planar top surface, create a curved top surface from which the light beams are reflected, reducing the effectiveness of the upper thin film electrode in reflecting the light beams. As a result, the overall optical efficiency of the thin film actuated mirror array decreases.

To overcome the above problem of the method for manufacturing the thin film actuated mirror array, it has been suggested to incorporate in the thin film actuated mirror a tilting mirror that is formed and cantilevered on top of the actuating structures by using a second thin film sacrificial layer.

SUMMARY OF THE INVENTION

It is, therefore, a primary object of the present invention to provide a method for manufacturing a thin film actuated mirror array, each of the thin film actuated mirror having a tilting mirror formed and cantilevered on top of an actuating structure therein using a thin film sacrificial layer made of a poly-Si.

In accordance with one aspect of the present invention, there is provided a method for manufacturing a thin film actuated mirror array, the method comprising the steps of: preparing an active matrix including a substrate, an array of switching devices and an array of connecting terminals; forming a first sacrificial layer including an array of empty cavities; forming an array of actuating structures, each of the actuating structures including an elastic member, a lower electrode, an electrodisplacive member, an upper electrode and a via contact; forming a second sacrificial layer including an array of empty slots; forming an array of mirrors; removing the first and the second sacrificial layer, to thereby form the thin film actuated mirror array.

BRIEF DESCRIPTION OF THE DRAWINGS

The above and other objects and features of the present invention will become apparent from the following description of the preferred embodiments given in conjunction with the accompanying drawings, wherein:

FIGS. 2A to 2G are schematic cross sectional views illustrating a method for manufacturing the array of M×N thin film actuated mirrors in accordance with the present invention.

DETAILED DESCRIPTION OF THE PREFERRED EMBODIMENTS

Figure 1A:
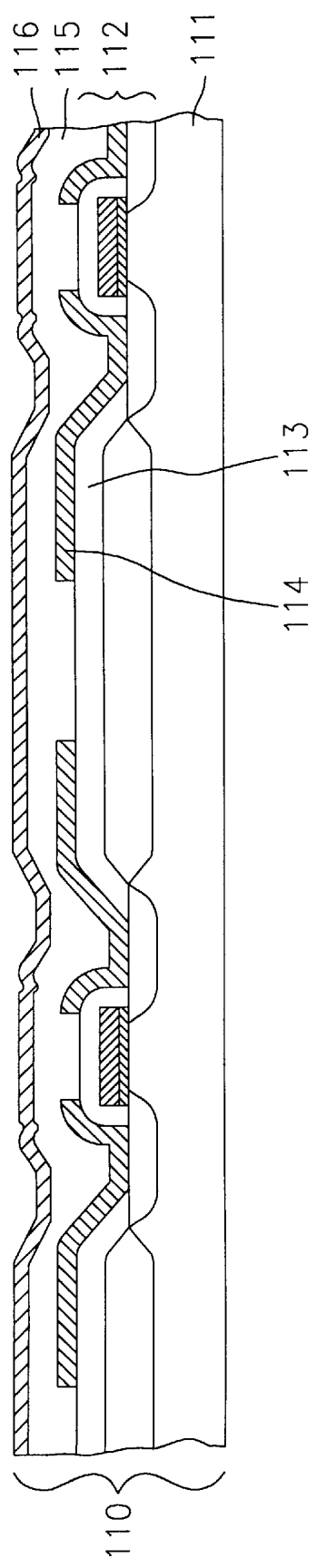
FIGS. 1A to 1E are schematic cross sectional views illustrating a method for the manufacture of a thin film actuated mirror array previously disclosed.
Figure 1B:
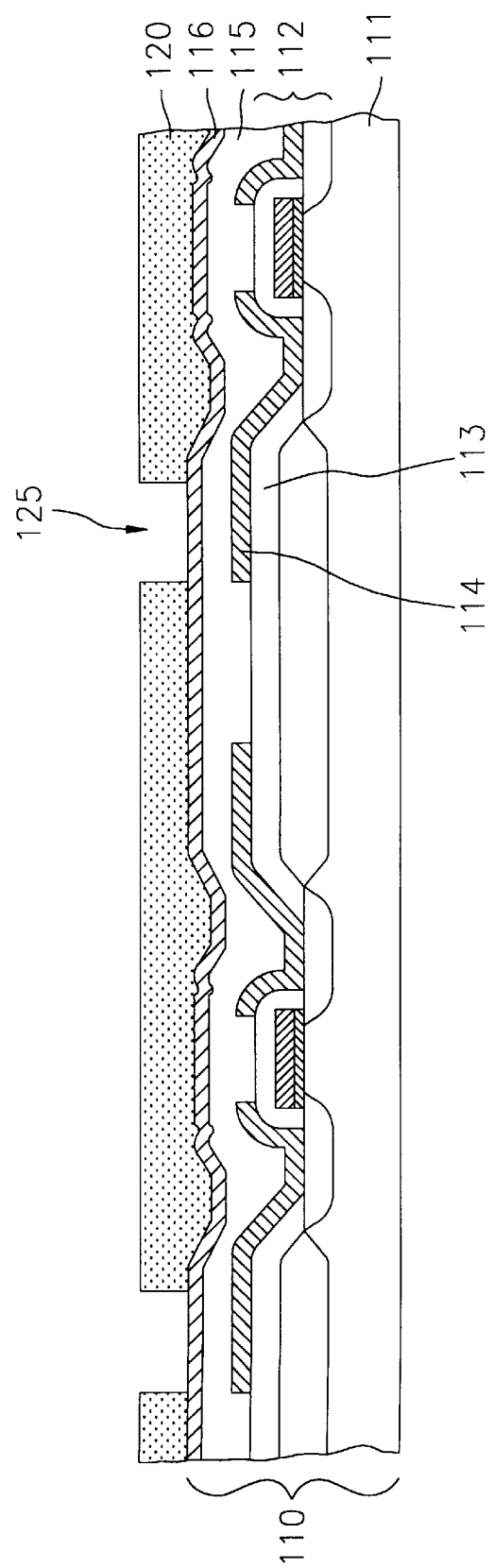
Figure 1C:
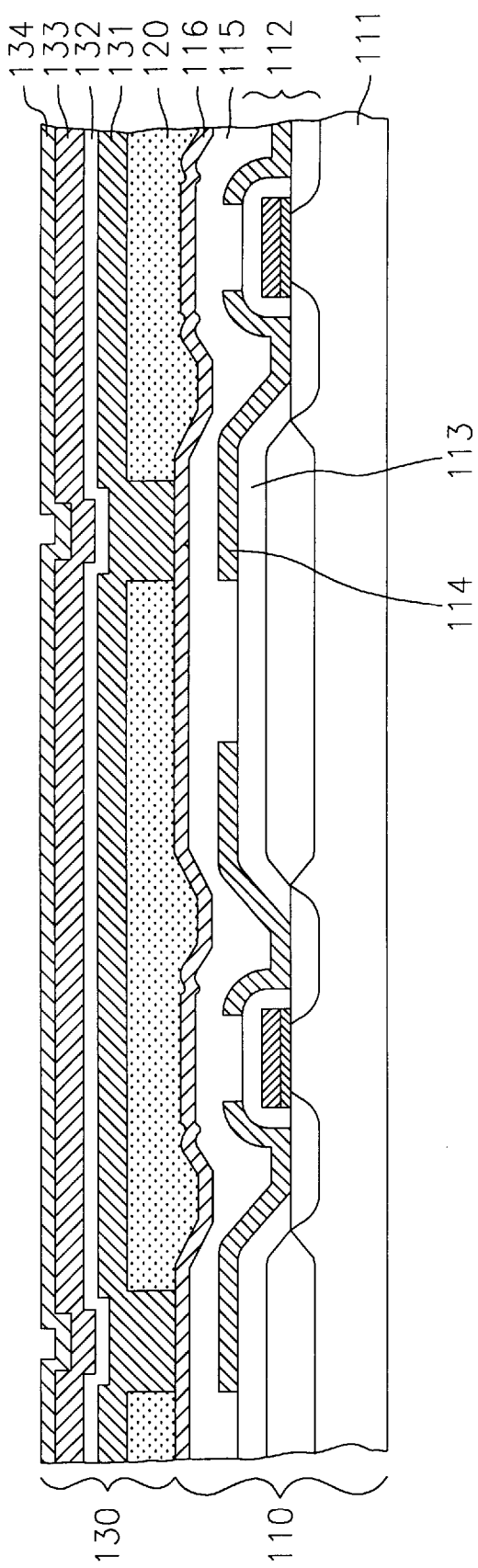
Figure 1D:
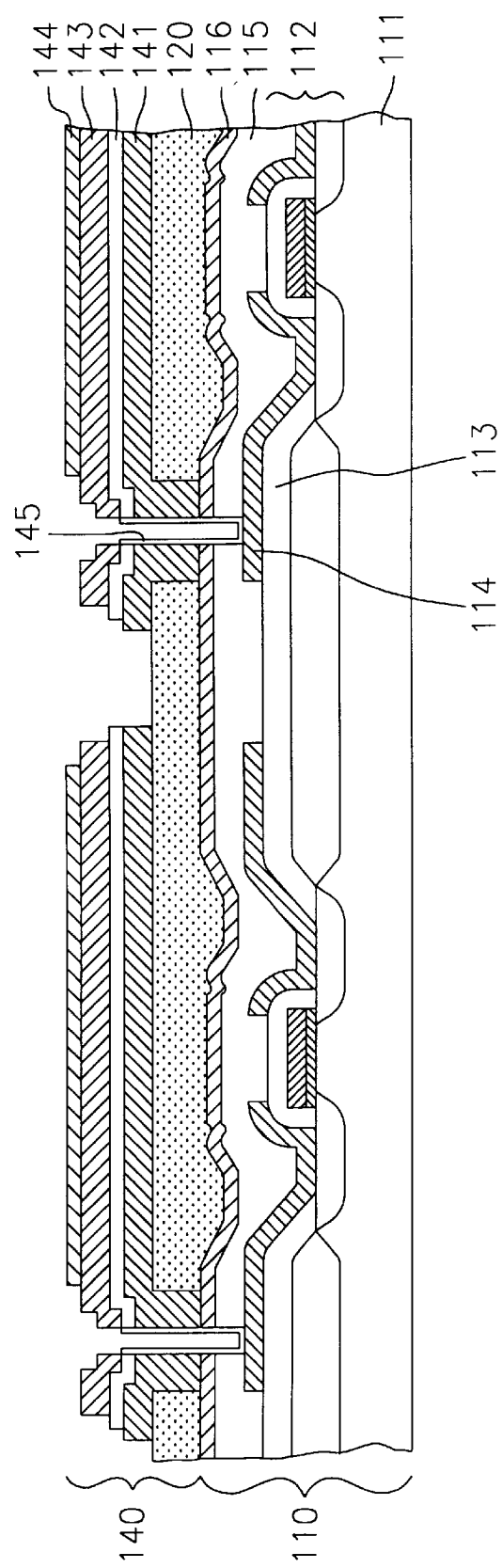
Figure 1E:
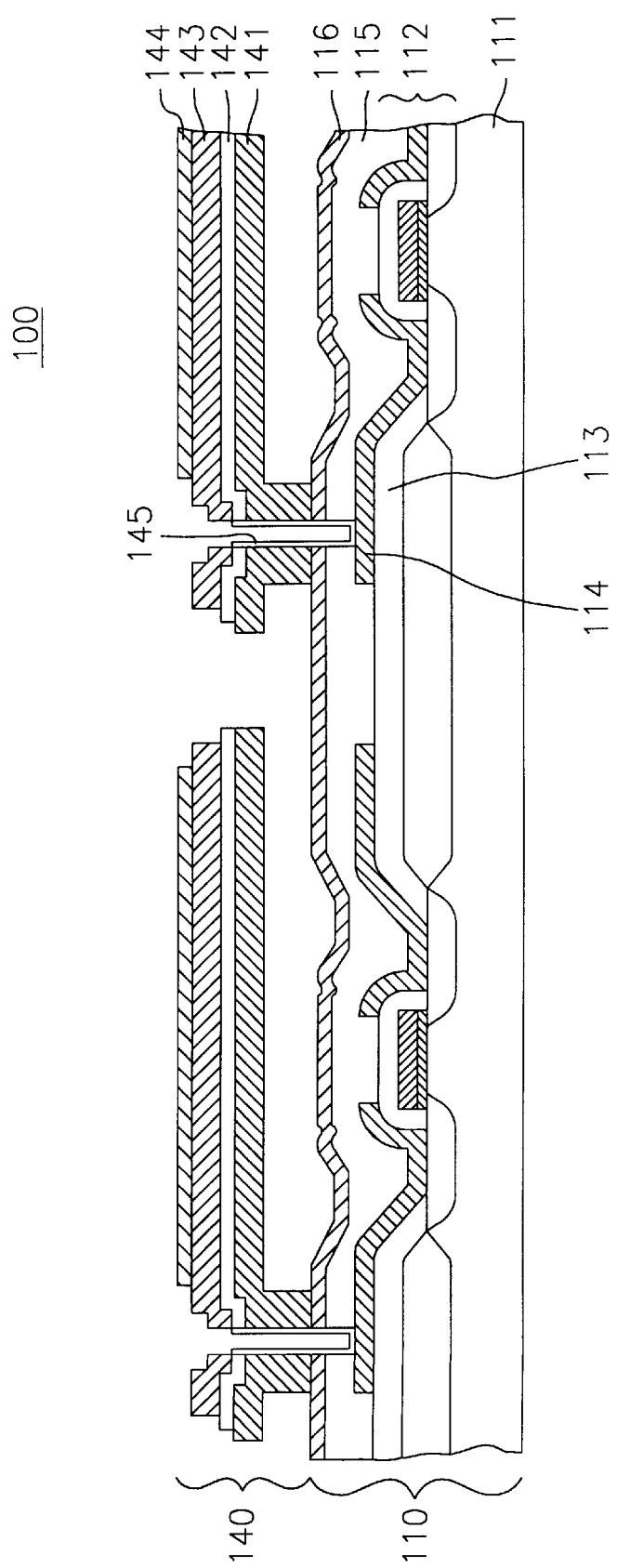

There are provided in FIGS. 2A to 2G schematic cross sectional views illustrating a method for the manufacturing a thin film actuated mirror array 200 in accordance with the present invention. It should be noted that like parts appearing in FIGS. 2A to 2G are represented by like reference numerals.

Figure 2A:
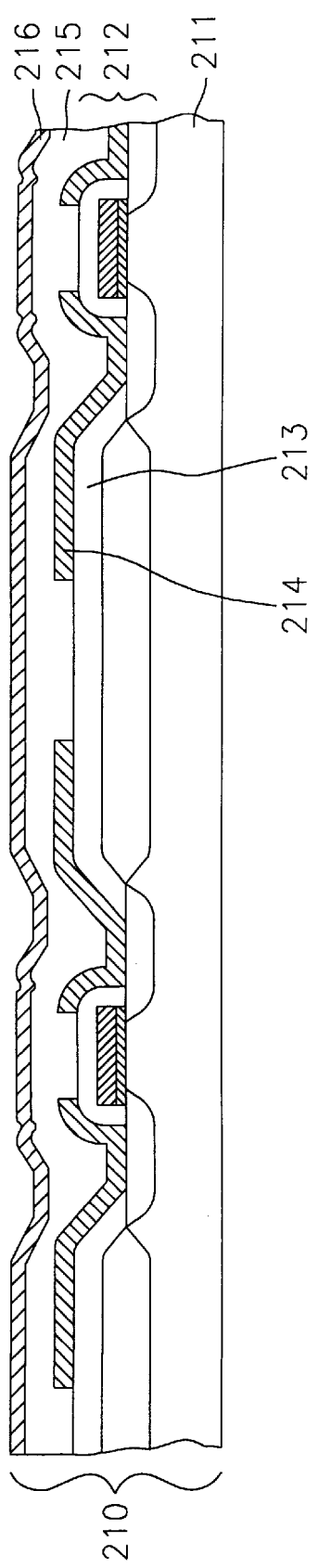

The process for the manufacture of the array 200 begins with the preparation of an active matrix 210 including a substrate 211, an array of switching devices 212, an array of connecting terminals 213, a passivation layer 214 and an etchant stopping layer 215, as shown in FIG. 2A. Each of the switching devices 212 made of, e.g., metal-oxide-semiconductor field effect transistors (MOSFET), is fabricated on top of the substrate 211 made of, e.g., Si-wafer, by using a common integrated-circuit process. Each of connecting terminals 213 made of a metal, e.g., tungsten (W), is electrically connected to a corresponding switching device in the switching device array 212. The passivation layer 214, made of, e.g., PSG, and having a thickness of 0.1–2 $\mu$m, on top of the switching device array 212 and the connecting terminal array 213 by using, e.g., a CVD or a spin coating method. The etchant stopping layer 215, made of silicon nitride, and having a thickness of 0.1–2 $\mu$m, is deposited on top of the passivation layer 214 by using, e.g., a low pressure chemical vapor deposition (LPCVD) method or a plasma enhanced chemical vapor deposition (PECVD) method.

Figure 2B:
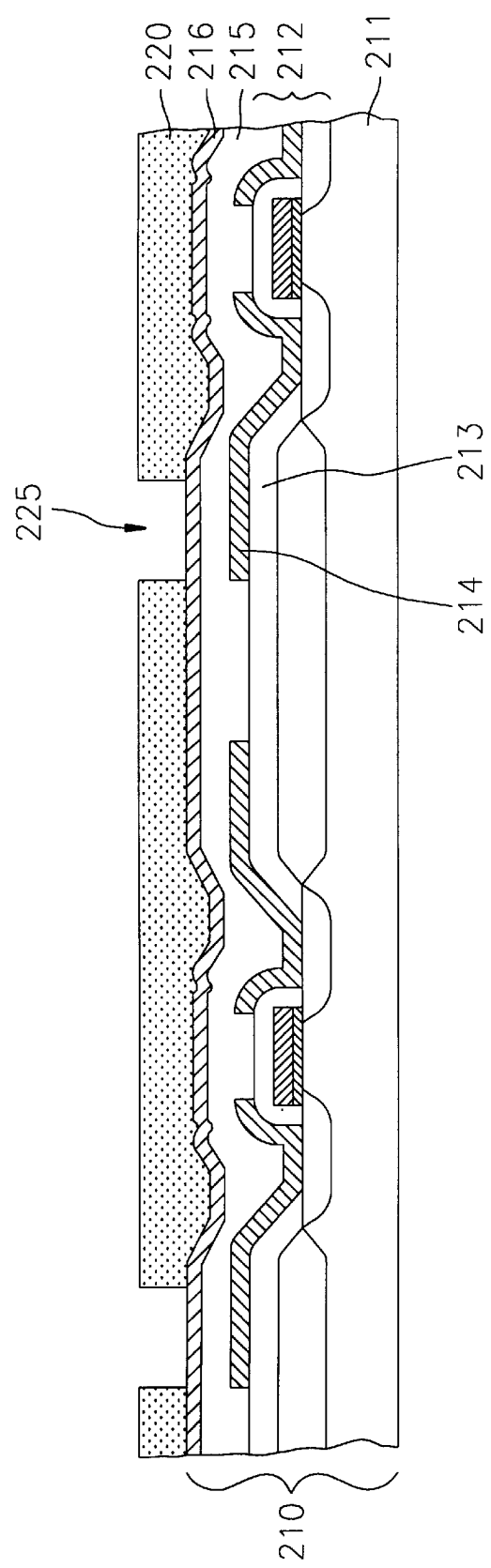

In a subsequently step, a first thin film sacrificial layer 220 having a flat top surface is formed on top of the active matrix 210 by using a CVD method, followed by a CMP method, wherein the first thin film sacrificial layer 220 is made of a poly-Si. Then, an array of empty cavities 225 is created in the first thin film sacrificial layer 220 to expose the active matrix 210 by using a dry or a wet etching method, as shown in FIG. 2B.

In a next step, an elastic layer 231, made of a silicon nitride and having a thickness of 0.1–2 $\mu$m, is deposited on top of the thin film sacrificial layer 220 including the empty cavities 225 by using a LPCVD or a PECVD method.

Thereafter, a lower thin film layer 232, made of an electrically conducting material, e.g., Pt or Pt/Ta, and having a thickness of 0.1–2 $\mu$m, is formed on top of the elastic layer 231 by using a sputtering or a vacuum evaporation method.

Then, a thin film electrodisplacive layer 233, made of a piezoelectric material, e.g., PZT, or an electrostrictive material, e.g., PMN, and having a thickness of 0.1–2 $\mu$m, is deposited on top of the lower thin film layer 232 by using an evaporation, a sol-gel, a sputtering or a CVD method.

Figure 2C:
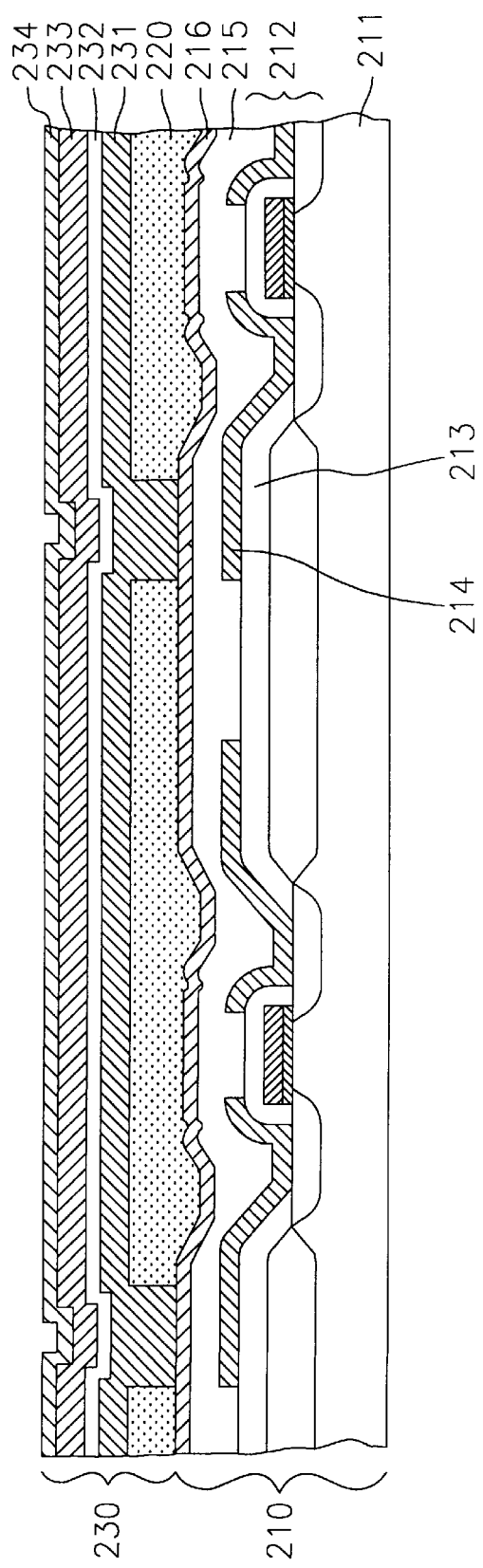

Subsequently, an upper thin film layer 234, made of an electrically conducting and light reflecting material, e.g., aluminum (Al) or silver (Ag), and having a thickness of 0.1–2 $\mu$m, is formed on top of the thin film electrodisplacive layer 233 by using a sputtering method, thereby forming a multiple layered structure 230, as shown in FIG. 2C.

In an ensuing step, the multiple layered structure 230 is patterned by using a photolithography or a laser trimming method to expose the first thin film sacrificial layer 220.

Figure 2D:
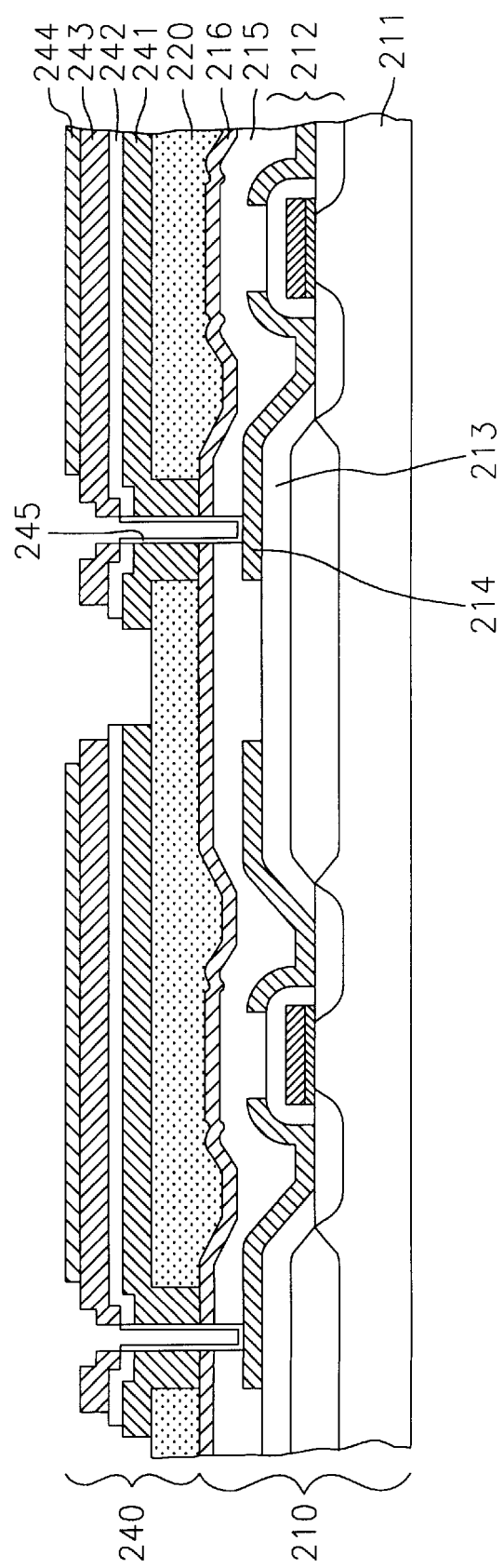

In a subsequent step, an array of via contacts 245 made of a metal, e.g., tungsten(W), is formed by using a lift-off method, thereby forming an array of actuating structures 240, wherein each of actuating structures 240 includes an upper thin film electrode 244, a thin film electrodisplacive member 243, a lower thin film electrode 242, an elastic member 241 and a via contact 245, as shown in FIG. 2D. Each of the via contacts 245 extends from top of the lower thin film electrode 242 to top of a corresponding connecting terminal in the connecting terminal array 213. Each of the lower thin film electrode 242 is electrically connected to the corresponding connecting terminal 213, thereby functioning as a signal electrode and each of the upper thin film electrode 244 is electrically connected to ground, thereby functioning as a common bias electrode.

Figure 2E:
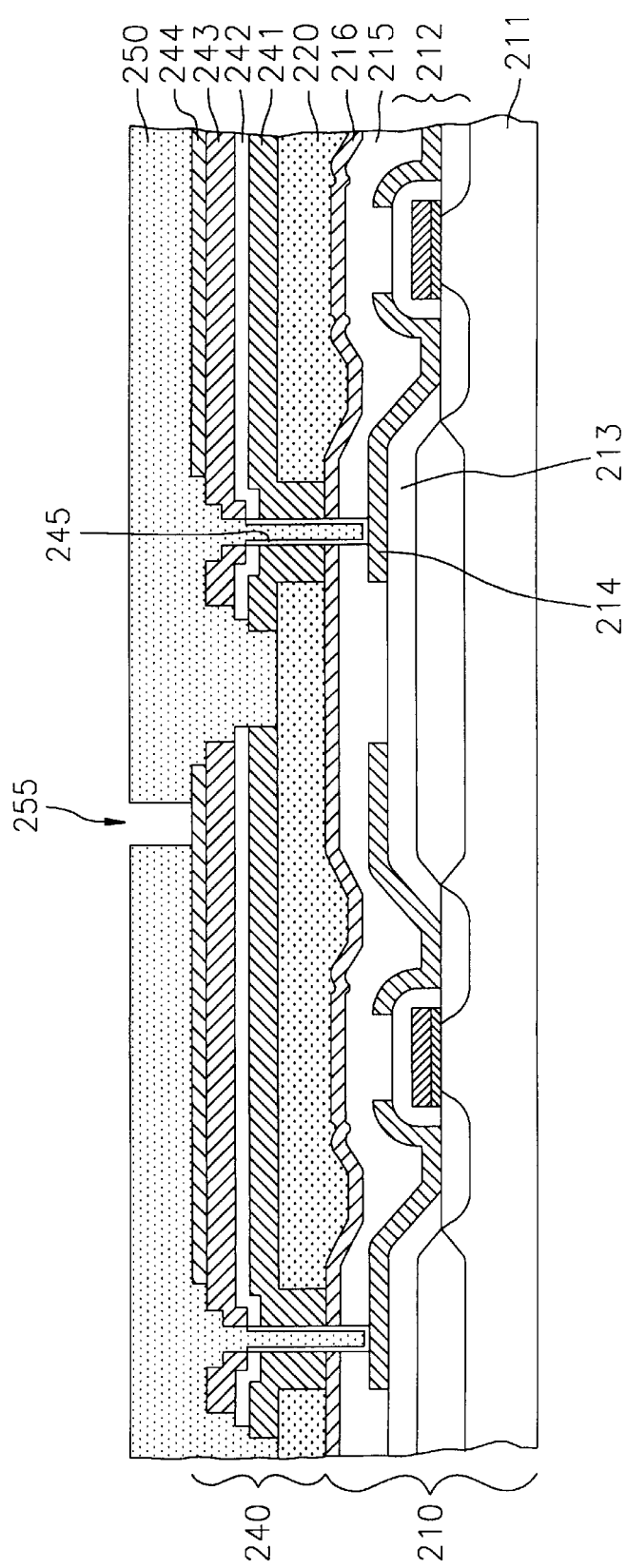

In a following step, there is formed on top of the actuating structures 240 a second thin film sacrificial layer 250 having a flat top surface, by using a CVD method, followed by a CMP method, wherein the second thin film sacrificial layer 250 is made of a poly-Si and has a thickness of about 4 $\mu$m. Then, an array of empty slots 255 is created in the second thin film sacrificial layer 250 to expose the actuating structures 240 by using a dry or a wet etching method, as shown in FIG. 2E.

Figure 2F:
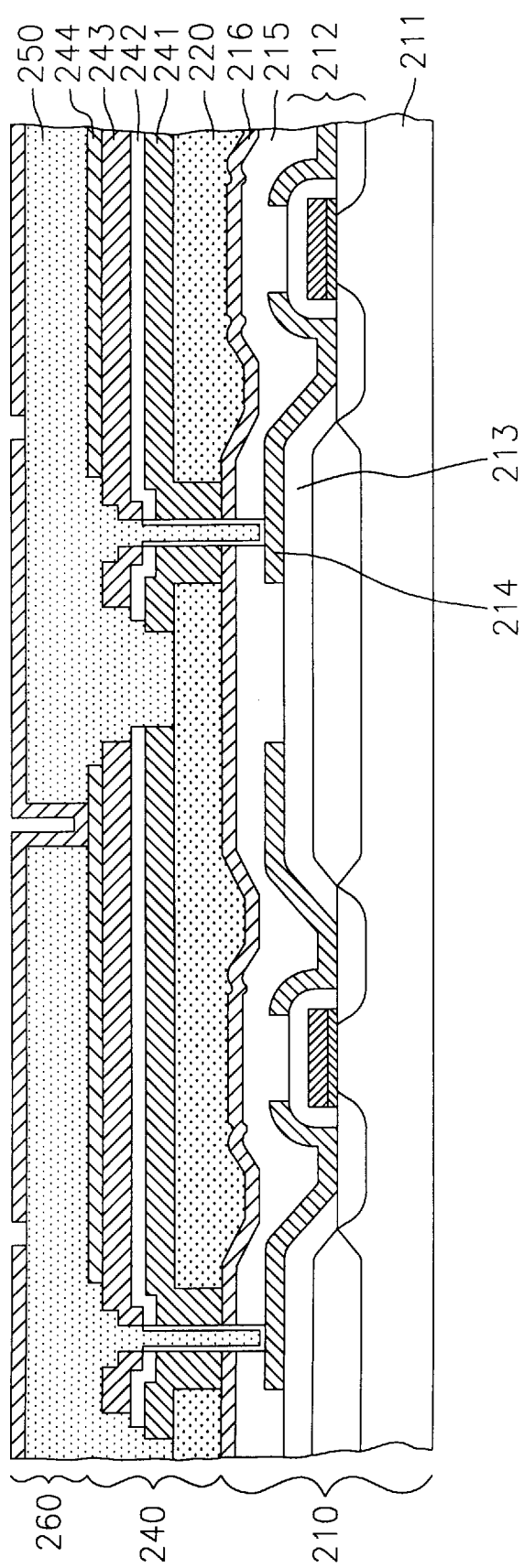

In a next step, an array of mirrors 260 made of a light reflecting material, e.g., Al, and having a thickness of 0.1–2 $\mu$m, is formed on top of the second thin film sacrificial layer 250 by using a sputtering method, wherein a center portion of each of the mirrors 260 is affixed to one of the actuating structures 240 through the empty slots 255, in such a way that each of the mirrors 260 corresponds to each of the actuating structures 240 by one to one, as shown in FIG. 2F.

Finally, the second and first thin film sacrificial layer 250, 220 is removed by using a vapor etching method using a XeF$_2$ gases to thereby form the thin film actuated mirror array 200, as shown in FIG. 2G.

In the above-described method, the poly-Si is chosen as a material for the first and the second thin film sacrificial layers. First, by using the poly-Si, it is ease to flatten the second thin film sacrificial layer by using the CMP method, which will, in turn, ensure a planar top surface for the mirrors, resulting in increasing the optical efficiency of the thin film actuated mirror array. Further, when the first and the second thin film sacrificial layer are removed by using a vapor etching method using a $XeF_2$ gases, no residue will be left, which will, in turn, prevent the active matrix, the actuating structures and the mirrors from sticking together, again resulting in the increased optical efficiency.

While the present invention has been described with respect to certain preferred embodiments only, other modifications and variations may be made without departing from the scope of the present invention as set forth in the following claims.

What is claimed is:

1. A method for manufacturing a thin film actuated mirror array comprising the steps of:

preparing an active matrix including a substrate, an array of switching devices and an array of connecting terminals;

forming a first sacrificial layer including an array of empty cavities;

forming an array of actuating structures, each of the actuating structures including an elastic member, a lower electrode, an electrodisplacive member, an upper electrode and a via contact;

forming a second sacrificial layer including an array of empty slots;

forming an array of mirrors;

removing the first and the second sacrificial layer, respectively, to thereby form the thin film actuated mirror array.

2. The method of claim 1, wherein the first and the second sacrificial layers are formed by: depositing a sacrificial material; flattening the sacrificial material, thereby forming a sacrificial layer; and partially etching the sacrificial layer.

3. The method of claim 2, wherein the sacrificial material is a poly-Si.

4. The method of claim 2, wherein the sacrificial material is flattened by using a chemical mechanical polishing method.

5. The method of claim 1, wherein the first and the second sacrificial layers are removed by using a vapor etching method.

6. The method of claim 5, wherein the vapor etching method includes an use of $XeF_2$ gases.

7. The method of claim 1, wherein a center portion in each of the mirrors is affixed to one of the actuating structures through a corresponding empty slot.

8. The method of claim 7, wherein the active matrix further includes a passivation layer and an etchant stopping layer.

* * * * *